United States Patent [19]

Hashimoto et al.

[11] Patent Number: 4,862,413
[45] Date of Patent: Aug. 29, 1989

[54] SEMICONDUCTOR ROM WITH REDUCED SUPPLY VOLTAGE REQUIREMENT

[75] Inventors: Masashi Hashimoto, Garland, Tex.; Tadashi Tachibana, Miho, Japan

[73] Assignee: Texas Instruments Incorporated, Dallas, Tex.

[21] Appl. No.: 180,648

[22] Filed: Apr. 4, 1988

Related U.S. Application Data

[63] Continuation of Ser. No. 839,844, Mar. 13, 1986, abandoned.

[30] Foreign Application Priority Data

Mar. 29, 1985 [JP] Japan .................................. 60-65556

[51] Int. Cl.⁴ ............................................ G11C 17/00
[52] U.S. Cl. .................................. 365/104; 365/226; 365/189.09
[58] Field of Search ................. 365/94, 103, 104, 203, 365/204, 210, 230, 226

[56] References Cited

U.S. PATENT DOCUMENTS

| 4,021,781 | 5/1977 | Caudel | 365/104 |
| 4,318,014 | 3/1982 | McAlister et al. | 365/104 |
| 4,592,027 | 5/1986 | Masaki | 365/189 |
| 4,628,486 | 12/1986 | Sakui | 365/230 |

FOREIGN PATENT DOCUMENTS

| 0114193 | 9/1981 | Japan | 365/185 |
| 0040798 | 3/1982 | Japan | 365/104 |
| 0136996 | 7/1985 | Japan | 365/104 |

Primary Examiner—Stuart N. Hecker
Assistant Examiner—Glenn A. Gossage
Attorney, Agent, or Firm—William E. Hiller; N. Rhys Merrett; Melvin Sharp

[57] ABSTRACT

A memory device including a voltage stepdown circuit is proposed in which a reduced reference voltage is produced from a supplied reference voltage and is passed to the selected one of the row lines of the memory array after all the row lines are discharged to ground potential, while the supplied reference voltage is fed directly, viz., without reduction, to all the control circuits of the device. The voltage stepdown circuit provided in the memory device is thus relieved from the burden to supply current to the control circuits and has only to feed the selected one of the row lines so that the field-effect transistors forming the voltage stepdown circuit can be fabricated to have channel regions with significantly reduced widths.

3 Claims, 3 Drawing Sheets

SEMICONDUCTOR ROM WITH REDUCED SUPPLY VOLTAGE REQUIREMENT

This application is a continuation of application Ser. No. 839,844, filed Mar. 13, 1986, now abandoned.

FIELD OF THE INVENTION

The present invention relates to a semiconductor memory device and, more particularly, to a semiconductor read-only memory device implemented on a semiconductor substrate.

BACKGROUND OF THE INVENTION

One of the most basic demands in the art of semiconductor memory devices is to realize memory devices which feature high speed performance and low production cost per bit. Incessant research and development efforts have therefore been made to increase the cell densities of semiconductor memory devices to meet such a demand.

One important approach to implementation of a high-density semiconductor memory device is apparently to use shrunk design rules in fabricating the device because such shrunk design rules result n significant reduction in the area which each of the memory cells of the memory cell array occupies on a single semiconductor substrate. From another point of view, however, the use of shrunk design rules in fabricating a semiconductor memory device gives rise to an increase in the current density of the various on-chip control circuits of the memory device. Unless substantial reduction is achieved in the voltage to be distributed to such control circuits of the memory device, there would be caused generation of heat from the conductors included in the circuits and disconnection or breaks of the conductors due to electromigration.

A high-density semiconductor memory device thus uses an on-chip voltage stepdown circuit to reduce the reference voltage supplied from an off-chip source, as well known in the art. Such a voltage stepdown circuit is typically composed of a combination of two metal-oxide-semiconductor field-effect transistors connected between the reference voltage source and each of the control circuits provided in the memory device. Each of these field-effect transistors is fabricated to have a certain threshold voltage through appropriate selection of, principally, the thickness of gate oxide layer of the transistor. Furthermore, each of the transistors forming the voltage stepdown circuit has its channel region dimensioned to provide a width-to-length ratio which is large enough to supply a sufficient current to the individual control circuits of the memory device. The voltage stepdown circuit composed of the field-effect transistors thus designed occupies a disproportionally large area of the semiconductor substrate, with a consequent penalty of reducing the proportion of the substrate area available for the memory cell array. This is objectionable for the purpose of increasing the integration density of the memory cells which can be fabricated on the single substrate.

SUMMARY OF THE INVENTION

A memory device proposed by the present invention is characterized, first of all, in that a reduced reference voltage is produced from a supplied reference voltage and is passed to the selected one of the row lines of the memory array after all the row lines are discharged to ground potential, while the supplied reference voltage is fed directly, viz., without reduction, to all the control circuits of the device. The voltage stepdown circuit provided in the memory device is thus relieved from the burden to supply current to the control circuits and has only to feed the selected one of the row lines. For this reason, the field-effect transistors forming the voltage stepdown circuit can be fabricated to have their channel regions dimensioned to provide significantly reduced widths. Such reduction in the channel widths of the field-effect transistors results in a decrease in the proportion of area which the voltage stepdown circuit occupies on the semiconductor substrate. Also achievable in the read-only memory device embodying the present invention are the reduction in the widths of the row lines of the memory cell array and the use of shrunk design rules in fabricating the field-effect transistors forming the memory cells which memorizing predetermined logic states. These field-effect transistors can be fabricated with design rules which are significantly shrunk as compared to those used for the various control circuits included in the memory device. The features of a memory device according to the present invention result in reduction in the share in the total area of the substrate required by the on-chip control circuits of the memory device. This allows provision of the more memory cells on a single semiconductor substrate and accordingly the use of the higher integration density of the device.

In accordance with the present invention, there is thus provided a semiconductor read-only memory device for use with reference voltage source means for supplying a predetermined reference voltage and address signal source means for supplying address signals, comprising (a) an array of memory cells respectively located at the intersections between a first set of conductor lines and a second set of conductor lines, each of the memory cells having stored therein one of two different logic states; (b) control circuits including first and second address means respectively connected to the first and second sets of conductor lines and responsive to the address signals from the address signal source means for selecting one of the first set of conductor lines and one of the second set of conductor lines during each address cycle; (c) conductive means directly connecting each of the control circuits to the reference voltage source means; (d) a voltage stepdown means connected to the reference voltage source means and operative to reduce the reference voltage to a predetermined reduced reference voltage; (e) a plurality of input transfer gate means connected between the reference voltage source means and the first set of conductor lines, respectively, through the voltage stepdown means; (f) the control circuits further including sensing means responsive to the voltage on each of the first set of conductor lines; and (g) a plurality of output transfer gate means connected between the reference voltage source means and the first set of conductor lines, respectively, across the sensing means.

BRIEF DESCRIPTION OF THE DRAWINGS

The drawbacks of a prior-art memory device and the features and advantages of a semiconductor read-only memory device according to the present invention will be more clearly understood from the following description taken in conjunction with the accompanying drawings in which like reference numerals designate similar or corresponding units and elements and in which.

DESCRIPTION OF THE PRIOR ART

Figure 1:
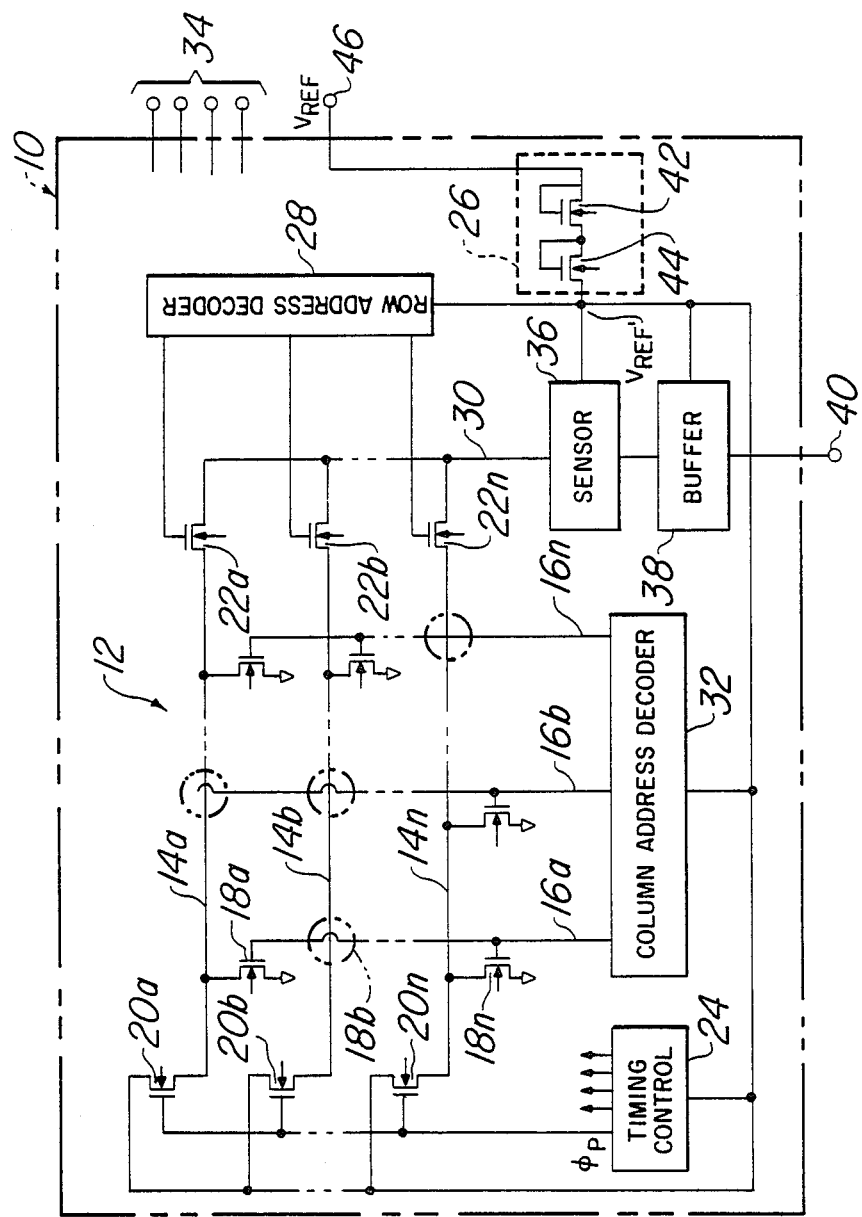
FIG. 1 is a schematic circuit diagram showing the circuit arrangement of a known semiconductor read-only memory device of the type to which the present invention generally appertains.

Referring to FIG. 1 of the drawings, a known semiconductor read-only memory device is assumed to be fabricated on a semiconductor substrate which is represented generally by reference numeral 10. The read-only memory device includes a memory cell array 12 of matrix form having a plurality of word or row lines 14a, 14b, . . . 14n and a plurality of bit or column lines 16a, 16b, . . . 16n. The memory cell array 12 further includes a number of memory cells located at the individual intersections of these row lines 14a, 14b, . . . 14nand column lines 16a, 16b, . . . 16n. The memory device herein shown is assumed to be of the mask type and has fixedly memorized therein a set of data in the form of binary logic states. The memory cells forming the memory cell array 12 are thus broken down to two major categories, one consisting of memory cells memorizing logic "0" states and the other consisting of memory cells memorizing logic "1" states. The memory cells of the former category are shown each in the form of a MOS (metal-oxide-semiconductor) transistor and the memory cells of the latter category are represented each by a circle in phantom line. Among these memory cells provided in the memory cell array 12, only the cells 18a, 18b and 18n located at the intersections between the column line 16a and the row lines 14a, 14b, . . . 14n, respectively, as shown will be herein considered for simplicity of description. Of these three particular memory cells 18a, 18b and 18n, each of the cells 18a and 18n is assumed to belong to the category of the memory cells memorizing logic "0" states and the cell 18b assumed to belong the category of the memory cells memorizing logic "1" states. Each of the memory cells 18a and 18n memorizing the logic "0" states is further assumed, by way of example, to be implemented by an n-channel MOS field-effect transistor (hereinafter referred to simply as FET) of the enhancement design. Thus, the memory cells 18a and 18n have their gates jointly connected to the column line 16a, their sources connected to the row lines 14a and 14n, respectively, and their drains connected to ground level. On the other hand, the memory cell 18b memorizing the logic "1" state is implemented by a device region with a thickened gate oxide layer providing no active field-effect transistor functions.

The row lines 14a, 14b, . . . 14n are connected each at one end to precharge FETs 20a, 20b, . . . 20n, respectively, and at the other to FETs 22a, 22b, 22n, respectively, each serving as a transfer gate. The precharge FETs 20a, 20b, . . . 20n have their gates jointly connected to one output terminal of a timing control circuit 24 and their sources and drains connected between the row lines 14a, 14b, . . . 14n, and an on-chip voltage stepdown circuit 26, respectively. The transfer-gate FETs 22a, 22b, . . . 22n have their gates connected in parallel to output terminals of a row address decoder 28 and their sources and drains connected between a common bus 30 and the row lines 14a, 14b, . . . 14n, respectively. The column lines 16a, 16b, . . . 16n are connected to output terminals of a column address decoder 32. Each of the row and column address decoders 28 and 32 has input terminals connected to lines 34 which represent row and column address input lines. The row address decoder 28 and column address decoder 32 further have input terminals (not shown) connected to the timing control circuit 24 and are responsive to control pulses which are to be supplied from the timing control circuit 24 to enable the decoders 28 and 32 to decode the address signals which appear at the address input lines 34. The common bus 30 is connected to input terminals of a sensing circuit 36 which has output terminals connected to an output buffer circuit 38. The output buffer circuit 38 in turn has an output terminal connected to a data output line 40.

The on-chip voltage stepdown circuit 26 is composed of a series combination of two FETs 42 and 44 each having its gate and drain coupled together. The FET 42 has its drain connected to a source 46 of a predetermined reference voltage $V_{REF}$ of, for example, 5 volts and its source connected to the drain of the FET 44. The FET 44 has its source connected to input terminals of the timing control circuit 24, row address decoder 28, column address decoder 32, sensing circuit 36 and output buffer circuit 38 as well as the precharge FETs 20a, 20b, . . . 20n. Each of these FETs 42 and 44 forming the voltage stepdown circuit 26 has a threshold voltage of about 1 volt so that a reduced reference voltage $V'_{REF}$ of approximately 3 volts appears at the output terminal of the voltage stepdown circuit 26.

Figure 2:
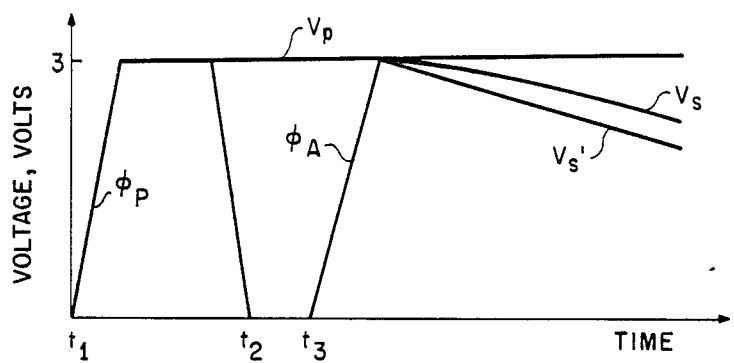
FIG. 2 is a time chart showing the waveforms of some voltage signals which may appear in the memory device shown in FIG. 1 during of the device.

The row address decoder 28 is operative to provide output signals on the row lines 14a, 14b, . . . 14n and, likewise, the column address decoder 32 is operative to provide output signals on the column lines 16a, 16b, . . . 16n each in response to signals supplied to the address input lines 34. An output signal from the memory device appears at the data output line 40 through the output buffer circuit 38. When, now, the timing control circuit 24 produces a clock pulse $\phi_P$ at time $t_1$ as indicated in FIG. 2, all the precharge FETs 20a, 20b, . . . 20n are caused to turn on in response to a high voltage signal applied to the gates of the transistors 20a, 20b, . . . 20n. The current from the voltage stepdown circuit 26 is passed through the FETs 20a, 20b, . . . 20n to the individual row lines 14a, 14b, . . . 14n, which are accordingly precharged to about 3 volts. In response to the shift of the $\phi_P$ to a low voltage level at time $t_2$ as indicated in FIG. 2, the FETs 20a, 20b, . . . 20n turn off so that each of the row lines 14a, 14b, . . . 14n floats at the precharge voltage as indicated by horizontal line $V_p$ in FIG. 2. Address signals are then decoded by the row address decoder 28 and column address decoder 32 in response to control pulses from the timing control circuit 24 so that, at time $t_3$, active high voltage signals appear on, for example, the column line 16a and the gate of the transfergate FET 22a connected to the row line 14a, as commonly indicated by line $_A$ in FIG. 2. The transfer-gate FET 22aturns on in response to the active high voltage signal from the row address decoder 28 so that the memory cell 18a memorizing the logic "0" state is selected and is thus caused to turn on. It therefore follows that the stray capacitance on the row line 14a is conducted to ground via the source and drain of the FET forming the memory cell 18a so that the potential at the row line 14a decreases gradually as indicated by curve $V_s$ in FIG. 2. The decrease in the potential at the row line 14a is accompanied by a corresponding decrease in the potential on the common bus 30 connected to the line 14a through the FET 22a as indicated by curve $V_s$ in FIG. 2. The reduction in the potential on the common bus 30 is detected by the sensing circuit 36, which now knows that the bit of information stored in the memory cell 18a is of the logic "0" state. The knowledge which the sensing circuit 36 has thus acquired is converted into a voltage signal stepped up to, for example, 5 volts by means of the output buffer circuit 38 and the resultant output signal is supplied to the data output line 40.

Each of the FETs 42 and 44 forming the voltage stepdown circuit 26 is fabricated to have a threshold voltage of, for example, about 1 volt through appropriate selection of, for example, the thickness of its gate oxide layer. In addition, each of the FETs 42 and 44 has its channel region dimensioned to provide a width-to-length ratio which is large enough to supply a sufficient current to each of the timing control circuit 24, row address decoder 28, column address decoder 32, sensing circuit 36 and buffer circuit 38 and to the precharge FETs 20a, 20b, ... 20n. The voltage stepdown circuit 26 composed of the FETs 42 and 44 thus designed occupies a large area of the semiconductor substrate 10. Where the read-only memory is fabricated with standard design considerations, the circuits 24, 26, 28, 32, 36, 38 other than the transistors forming the memory cell array 12 thus account for more than 50 per cent of the total area of the substrate 10. Such a large share in the substrate area as claimed by these component circuits is reflected by the reduced proportion of the area available for the memory cell array 12 and provides a bar to increasing the integration density of the memory cells which can be fabricated on the substrate 10, although the density of the memory cell array 12 could be more or less increased by the use of shrunk design rules for the memory device.

DESCRIPTION OF THE PREFERRED EMBODIMENT

Figure 3:
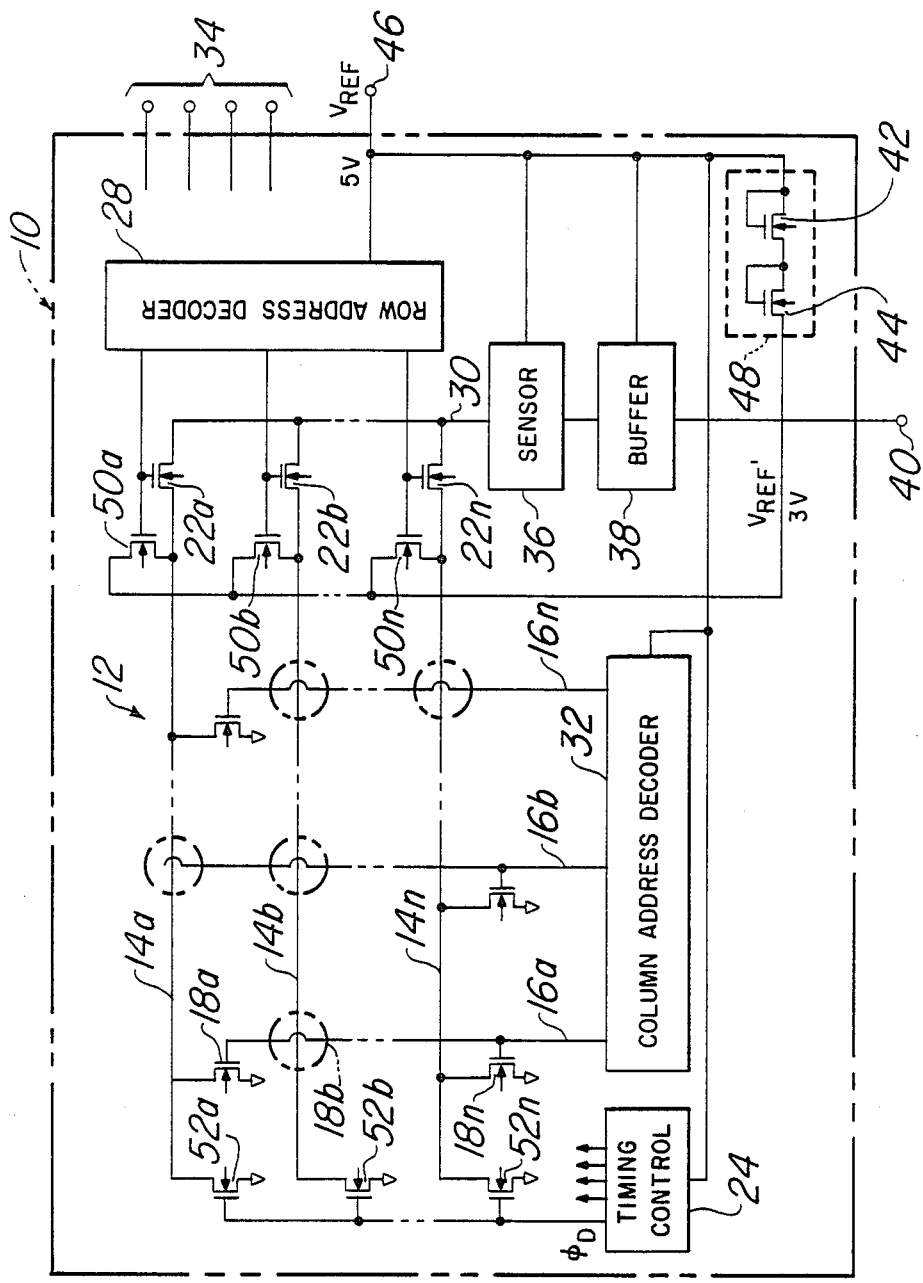
FIG. 3 a diagram similar to FIG. 1 but shows the circuit arrangement of a preferred embodiment of a semiconductor read-only memory device according to the present invention.

FIG. 3 of the drawings shows a preferred embodiment of a semiconductor read-only memory device constructed and arranged in accordance with the present invention to circumvent such a problem of a prior-art memory device of the described general nature.

The read-only memory device embodying the present invention is also assumed to be fabricated on a single semiconductor substrate 10 and comprises a memory cell array 12 having row lines 14a, 14b, ... 14n, column lines 16a, 16b, ... 16n and a number of memory cells located at the individual intersections of these row lines and column lines. The memory device herein shown is also assumed to be of the mask type and has fixedly memorized therein a set of data in the form of binary logic states, thus including cells 18a, 18b and 18n located at the intersections between the column line 16a and the row line 14a, 14b, ... 14n respectively. As in the described prior-art memory device, each of the memory cells 18a and 18n is further assumed to belong to the category of the memory cells memorizing logic "0" states and is implemented by an FET, while the cell 18b is further assumed to belong the category of the memory cells memorizing logic "1" states and has no active field-effect transistor functions. Thus, the memory cells 18a and 18n have their gates jointly connected to the column line 16a, their sources connected to the row lines 14a and 14n, respectively, and their drains connected to ground level.

As in the prior-art memory device described with reference to FIG. 1, the row lines 14a, 14b, ... 14n are connected each at one end to output transfer-gate FETs 22a, 22b, ... 22n, respectively, which have their gates connected in parallel to output terminals of a row address decoder 28 and their sources and drains connected between a common bus 30 and the row lines 14a, 14b, ... 14n, respectively. The column lines 16a, 16b, ... 16n are connected to output terminals of a column address decoder 32. Each of the row and column address decoders 28 and 32 has input terminals connected to a timing control circuit 24 and row and column address input lines 34. The common bus 30 is connected to input terminals of a sensing circuit 36 which has output terminals connected to an output buffer circuit 38. The output buffer circuit 38 in turn has an output terminal connected to a data output line 40.

The read-only memory device embodying the present invention further comprises an on-chip voltage stepdown circuit 48 connected to an off-chip source 46 of a predetermined reference voltage $V_{REF}$ of, for example, 5 volts. In the embodiment herein shown, the reference voltage source 46 is connected not only to the voltage stepdown circuit 46 but also to input terminals of the timing control circuit 24, row address decoder 28, column address decoder 32, sensing circuit 36 and output buffer circuit 38 as shown. The voltage stepdown circuit 48 per se is similar in construction to its counterpart 26 in the prior-art memory device shown in FIG. 1 and is composed of a series combination of two FETs 42 and 44 each having its gate and drain coupled together. The FET 42 has its drain connected to the reference voltage source 46 and its source connected to the drain of the FET 44. Each of these FETs 42 and 44 forming the voltage stepdown circuit 48 has a threshold voltage of about 1 volt so that a reduced reference voltage $V_{REF}$ of approximately 3 volts appears at the source of the FET 44.

The FET 44 of the voltage stepdown circuit 48 has its source connected over the drains and sources of FETs 50a, 50b, ... 50n to the row lines 14a, 14b, ... 14n, respectively. These FETs 50a, 50b, ... 50n and have their drains jointly connected to the source of the FET 44 of the voltage stepdown circuit 48 and their sources connected to the row lines 14a, 14b, ... 14n, respectively. The gates of the FETs 50a, 50b, ... 50n are connected to the gates of the output transfer-gate FETs 22a, 22b, ... 22n, respectively, and accordingly to the output terminals of the row address decoder 28 as shown. The row lines 14a, 14b, ... 14n thus connected each at one end to the output transfer-gate FETs 22a, 22b, ... 22n and the FETs 50a, 50b, ... 50n respectively, are connected at the other ends to discharge FETs 52a, 52b, ... 52n, respectively. These discharge FETs 52a, 52b, ... 52n have their gates jointly connected to one output terminal of the timing control circuit 24, their sources connected to the row lines 14a, 14b, ... 14n, respectively, and their drains connected to ground level. The timing control circuit 24 further has output terminals connected to the row address decoder 28 and column address decoder 32 which are thus enabled to decode address signals on the address input lines 34 in response to control pulses supplied from the timing control circuit 24.

Figure 4A:
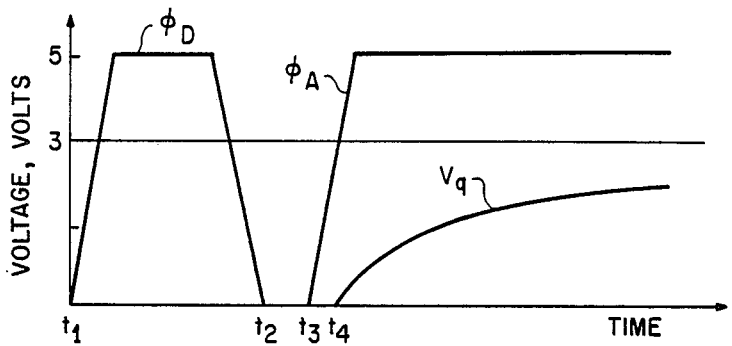
FIGS. 4A and 4B are timecharts showing the waveforms of some voltage signals which may appear in the memory device shown in FIG. 3 during operation of the device.

In operation, the timing control circuit 24 will produce a clock pulse $\phi_D$ at time $t_1$ as indicated in FIG. 4A, all the discharge FETs 52a, 52b, ... 52n are caused to turn on in response to a high voltage signal applied to the gates of the transistors 52a, 52b, ... 52n. All the row lines 14a, 14b, ... 14n of the memory cell array 12 are thus connected to ground through the drains and sources of the discharge FETs 52a, 52b, ... 52n and are accordingly discharged to ground potential. When the $\phi_D$ shifts to a low voltage level at time $t_2$ as indicated in FIG. 4A, the discharge FETs 52a, 52b, ... 52n turn off and disconnect the row lines 14a, 14b, ... 14n from the ground level. After the discharge FETs 52a, 52b, ... 52n are thus turned off, address signals are decoded by the row address decoder 2 and column address decoder 32 in response to control pulses from the timing control circuit 24 so that, at time $t_3$, active high voltage signals appear on, for example, the column line 16a and the gates of the output transfer gate FET 22a and FET 50a connected to the row line 14a, as commonly indicated by line $\phi_A$ in FIG. 4A. Each of the FETs 22a and 50a is accordingly caused to turn on in response to the active high voltage signal from the row address decoder 28. The FET 50a being thus turned on, the current appearing at the output terminal of the voltage stepdown circuit 48 is passed over to the row line 14a through the drain and source of the FET 50a. With the FET forming the memory cell 18a also turned on in response to the active high voltage signal from the column address decoder 32, there appears on the row line 14a a voltage which rises gradually to a certain value at time $t_4$, as indicated by curve $V_q$ in FIG. 4A. The value which the voltage on the row line 14a approaches is a fraction of the reduced reference voltage $V_{REF}$ (which is herein assumed to be 3 volts) of the voltage stepdown circuit 48 multiplied by the ratio between the resistances of the channel regions of the output transfer-gate FET 22a and FET 50a. The output 22a on the row line 14a having also been turned on in response to the active high voltage signal from the row address decoder 28, such a varying voltage on the row line 14a is passed through the FET 22a to the common bus 30 and via the common bus 30 further to the sensing circuit 36. The sensing circuit 36 operates to compare the varying input voltage with the reference voltage $V_{REF}$ from the reference voltage source the memory cell 18a and, when the voltage on the row line 14a is stabilized at the certain fraction of the reduced reference voltage $V_{REF}$ determines whether the fractional voltage has resulted from a memory cell of the logic "0" state or of the logic "1" state. It being herein assumed that the memory cell 18a memorizing the logic "0" state has been selected, the fractional voltage eventually established on the row line 14a is significantly lower than the reference voltage $V_{REF}$ of 5 volts as will be seen from curve $V_q$ of FIG. 4A. The sensing circuit 36 now determines that the bit of information stored in the memory cell 18a accessed is of the logic "0" state and informs the output buffer circuit 38 of the result of the determination. The output buffer circuit 38 then produces a voltage signal indicative of the result of the determination by the circuit 36 and supplies the voltage signal to the data output line 40.

Figure 4B:
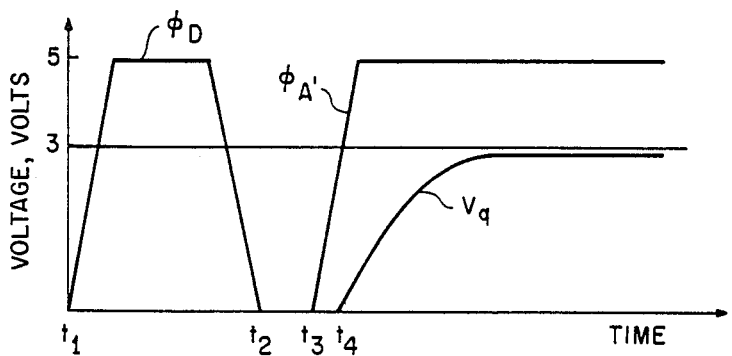

If, at time $t_3$, active high voltage signals appear on the column line 16a and the gates of the output transistor gate FET 22b and FET 50b connected to the row line 14b as commonly indicated by line $\phi_A'$ in FIG. 4B, each of the FETs 22b and 50b is caused to turn on in response to te active high voltage signal from the row address decoder 28. With the FET 50b thus turned on, the current appearing at the output terminal of the voltage stepdown circuit 48 is passed over to the row line 14b through the drain and source of the FET 50b. The memory cell 18b being of the logic "1" state, the row line 14b has no conduction path connected to ground so that there appears on the row line 14b a voltage which rises gradually to the output voltage from the voltage stepdown circuit 48 at time $t_4$, as indicated by curve $V_{q'}$ in FIG. 4B. The output transfer-gate FET 22b on the row line 14b having also been turned on in response to the active high voltage signal from the row address decoder 28, this varying voltage on the row line 14b is passed through the FET 22b to the common bus 30 and via the common bus 30 further to the sensing circuit 36. When the voltage on the row line 14b is stabilized at the reduced reference voltage $V_{REF}$ of 3 volts, the sensing circuit 36 determines that the particular voltage has resulted from a memory cell of the logic "1" state, informing the output buffer circuit 38 of the result of the determination. The output buffer circuit 38 then produces a voltage signal stepped up to, for example, 5 volts and supplies the voltage signal to the data output line 40.

As will have been understood from the foregoing description, the memory device embodying the present invention is, inter alia, characterized in that the reduced reference voltage $V_{REF}$ is supplied to the selected one of the row lines 14a, 14b, ... 14n through the associated one of the FETs 50a, 50b, ... 50n after all the row lines are discharged to ground potential, while the supplied reference voltage $V_{REF}$ is fed directly, viz., without reduction to all the control circuit 24, 28, 32, 36 and 38 of the device. The voltage stepdown circuit 48 is accordingly relieved from the burden to supply current to the control circuits 24, 28, 32, 36 and 38 of the device and has only to feed the selected one of the row lines 14a, 14b, ... 14n. For this reason, the FETs 42 and 44 forming the voltage stepdown circuit 48 can be fabricated to have their channel regions dimensioned to provide significantly reduced widths. Such reduction in the channel widths of the FETs 42 and 44 is reflected by a notable decrease in the proportion of area which the voltage stepdown circuit 48 occupies on the semiconductor substrate 10. Also achieved in the read-only memory device embodying the present invention are the reduction in the widths of the row lines 14a, 14b, ... 14n of the memory cell array 12 and the use of shrunk design rules in fabricating the FETs forming the memory cells memorizing the logic "0" states. These FETs can be fabricated with design rules which are significantly shrunk as compared to those used for the various control circuits 24, 26, 28, 32, 36 and 38 of the memory device. The combination of these outstanding features of a memory device according to the present invention results in a share of less than 50 per cent in the total area of the substrate accounted for by the on-chip control circuits of the memory device. This allows provision of the more memory cells on a single semiconductor substrate and accordingly the use of the higher integration density of the device. It may be noted that the FETs 42 and 44 forming the voltage stepdown circuit 48 in the described embodiment of a memory device according to the present invention are preferably fabricated so that the conductance of the channel region of each of the transistors is less than that ordinarily used for the transistors forming the voltage stepdown circuit in a prior-art memory device of the described nature.

The memory device embodying the present invention is further characterized in that current is supplied from the voltage stepdown circuit 48 only to the row line including the memory cell selected during each address cycle. This further contributes to reduction of the burden on the voltage stepdown circuit 44 and accordingly also to increasing the proportion of the substrate area which can be utilized for the formation of the memory cell array 12.

What is claimed is:

1. A semiconductor read-only-memory device for use with a source of original operating voltage, said semiconductor read-only-memory device comprising:

first and second sets of conductor lines respectively extending in crossing relation to each other and defining a plurality of intersections between respective individual conductor lines of said first and second sets of conductor lines;

a plurality of memory cells arranged in a matrix and corresponding in number to said plurality of intersections between said first and second sets of conductor lines, each of said memory cells being operably associated with a particular intersection of individual conductor lines from said first and second sets of conductor lines corresponding thereto;

voltage supply terminal means adapted to be connected to said source of original operating voltage as a supplied reference voltage;

control circuit means connected to said voltage supply terminal means for receiving the supplied reference voltage, said control circuit means including first and second addressing circuits respectively connected to said first and second sets of conductor lines for selecting one conductor line from each of said first and second sets of conductor lines in response to an applied address signal, the individual selected conductor lines defining a particular intersection identifying a memory cell corresponding to the address signal, a sensing circuit responsive to a voltage on a selected one of said first set of conductor lines to produce an output signal indicative of the logic state of the selected memory cell, and a timing control circuit connected to said first and second addressing circuits for controlling the operation thereof in a timed sequence in selecting conductor lines from said first and second sets of conductor lines to identify a memory cell in response to an address signal;

a voltage step down circuit connected to said voltage supply terminal means for producing a reduced reference voltage lower than the supplied reference voltage;

a plurality of discharge devices connected to each of said conductor lines include in said first set of conductor lines, said plurality of discharge devices having respective gates commonly connected to said timing control circuit and being simultaneously actuated in response to a first time signal pulse from said timing control circuit applied to the gates thereof to momentarily connect each of said conductor lines included in said first set of conductor lines to ground potential, said first set of conductor lines being effective to float at ground potential upon termination of said first time signal pulse;

a plurality of input transfer devices commonly connected to said voltage stepdown circuit and individually connected to a respective one of said conductor lines included in said first set of conductor lines, said plurality of input transfer devices having respective gates individually connected to said first addressing circuit;

one of said input transfer device being actuated in response to an output signal from said first addressing circuit selectively applied to the gate thereof in accordance with the address signal applied to said first and second addressing circuits for selectively applying the reduced reference voltage from said voltage stepdown circuit to the sole selected one of said first set of conductor lines corresponding to the actuated input transfer device;

a plurality of output transfer device commonly connected to said sensing circuit and respectively connected to individual ones of said first set of conductor lines, said plurality of output transfer devices having respective gates individually connected to said first addressing circuit; and one of said output transfer devices being actuated in response to the output signal from said first addressing circuit selectively applied to the gate thereof for selectively connecting the selected one of said first set of conductor lines to said sensing circuit.

2. A semiconductor read-only-memory device as set forth in claim 1, wherein said control circuit means further includes a buffer circuit connected to the output of said sensing circuit for providing an output corresponding to the logic state of the selected memory cell.

3. A semiconductor read-only-memory device as set forth in claim 1, wherein said conductor lines of said first set of conductor lines are row conductor lines, and said conductor lines of said second set of conductor lines are column conductor lines; and said first addressing circuit is a row address decoder circuit, and said second addressing circuit is a column address decoder circuit.

* * * * *